United States Patent
Yamakoshi et al.

(10) Patent No.: US 6,417,079 B1
(45) Date of Patent: Jul. 9, 2002

(54) DISCHARGE ELECTRODE, HIGH-FREQUENCY PLASMA GENERATOR, METHOD OF POWER FEEDING, AND METHOD OF MANUFACTURING SEMICONDUCTOR DEVICE

(75) Inventors: Hideo Yamakoshi; Koji Satake; Minoru Danno, all of Kanagawa-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 09/762,511

(22) PCT Filed: Jun. 16, 2000

(86) PCT No.: PCT/JP00/03941
§ 371 (c)(1),
(2), (4) Date: Aug. 2, 2001

(87) PCT Pub. No.: WO00/79844
PCT Pub. Date: Dec. 28, 2000

(30) Foreign Application Priority Data

Jun. 17, 1999 (JP) .......................................... 11-171564

(51) Int. Cl.⁷ .......................... H01L 21/20; H01L 21/36
(52) U.S. Cl. ...................... 438/485; 438/478; 438/680; 438/788; 427/569; 427/574
(58) Field of Search ................ 438/478, 485, 438/680, 788; 427/569, 574; 136/258

(56) References Cited

U.S. PATENT DOCUMENTS 5,846,612 A * 12/1998 Takaki et al. ............... 427/569
6,287,943 B1 * 9/2001 Fujioka et al. .............. 438/485
6,313,430 B1 * 11/2001 Fujioka et al. .......... 219/121.57

FOREIGN PATENT DOCUMENTS

| JP | 4-236781 | 8/1992 |
| JP | 11-354460 | 12/1999 |
| JP | 2000-58465 | 2/2000 |
| JP | 2000-164520 | 6/2000 |

OTHER PUBLICATIONS

Materials Research Society Symposium Proceedings—vol. 424, pp. 9–18—1997 Discussed in the specification, no month.

Materials Research Society Symposium Proceedings—vol. 377, pp. 27–32, 1995 Discussed in the specification, no month.

Glow Discharge Processes—Sputtering and Plasma Etching—Brian Chapman, John Wiley & Sons, Inc., pp.168–169, 1980 Discussed in the specification, no month.

* cited by examiner

Primary Examiner—Alexander G. Ghyka
(74) Attorney, Agent, or Firm—Armstrong, Westerman & Hattori, LLP

(57) ABSTRACT

A discharge electrode improves the uniformity of discharge such as plasma. The electrical discharge electrode, which receives high-frequency power and produces a discharge, comprises an electrode body adapted to receive high-frequency power, and a member for preventing the reflection of high-frequency power from the electrode body. The electrical discharge may comprise plasma generated by an electrical discharge.

17 Claims, 10 Drawing Sheets

(a)　　　　　　(b)

(a)　　　　　(b)

DISCHARGE ELECTRODE, HIGH-FREQUENCY PLASMA GENERATOR, METHOD OF POWER FEEDING, AND METHOD OF MANUFACTURING SEMICONDUCTOR DEVICE

TECHNICAL FIELD

The present invention relates to a discharge electrode, a high frequency plasma generator, a method of power feeding to a discharge electrode, and a method of manufacturing semiconductor device. More particularly, the present invention relates to a high frequency plasma generator used for forming a film of a semiconductor, such as amorphous silicon, microcrystal silicon, polycrystal thin silicon, silicon nitride and the like, used in a solar cell, a thin film transistor and the like, and etching a film of a semiconductor, and its discharge electrode, a method of power feeding to the discharge electrode, and a method of manufacturing semiconductor device using it.

BACKGROUND ART

As an example of a configuration of the high frequency plasma generator and a method of manufacturing semiconductor device using it, two typical examples of: ① a case of a usage of parallel plate electrodes; and ② a case of a usage of ladder electrodes are described in a case when amorphous silicon semiconductor thin film (hereafter, referred to as a-Si) is manufactured by using a plasma chemical vapor deposition apparatus (hereafter, referred to as a PCVD apparatus).

FIG. 11 shows one configuration example of an apparatus using the ① parallel plate electrodes usually used for the a-Si film formation. A substrate heater 2 is mounted within a reactor 1, and electrically grounded. A flat plate electrode 3 is mounted at a position opposite to the substrate heater 2, and it is placed, for example, 20 mm away from the substrate heater 2. An external high frequency power supply 4 is connected through an impedance matching device 5 and a coaxial cable 6 to the flat plate electrode 3. An earth shield 8 is mounted near the flat plate electrode 3 so that unnecessary plasma is not generated on a side opposite to a plane opposite to the substrate heater 2 of the flat plate electrode 3.

The a-Si film is formed in the following procedure.

At first, a substrate 16 on which the a-Si thin film is formed is placed on the substrate heater 2 whose temperature is set, for example, to 200° C. $SiH_4$ gas is introduced from a gas supply tube 17, for example, at a velocity of flow of 50 sccm. Then, a pressure within the reactor 1 is adjusted, for example, to 100 mTorr by adjusting an exhaust speed in a vacuum pump system (not shown) connected to a vacuum exhaust pipe 18.

The supply of high frequency electric power causes the plasma to be generated between the substrate 16 and the flat plate electrode 3. The impedance matching device 5 is adjusted such that the high frequency electric power is effectively fed to a plasma generator. The $SiH_4$ is decomposed in a plasma 19. The a-Si film is formed on a surface of the substrate 16. The a-Si film having a necessary thickness is formed, for example, by carrying out the film formation under the above-mentioned condition for about ten minutes.

FIG. 12 shows one configuration example of the apparatus using the ② ladder electrode 303. The ladder electrode is reported in detail, for example, in Japanese Laid Open Patent Application (JP-A-Heisei, 4-236781).

FIG. 13 is a view illustrating the structure of the ladder electrode 303 drawn from an A-direction of FIG. 12 so that it can be sufficiently understood.

The substrate heater 2 (not shown in FIG. 13) is mounted within the reactor 1, and electrically grounded. The ladder electrode 303 is mounted at the position opposite to the substrate heater 2, and it is placed, for example, 20 mm away from the substrate heater 2. The external high frequency power supply 4 is connected through the impedance matching device 5 and the coaxial cable 6 to the ladder electrode 303. An earth shield 308 is mounted near the ladder electrode 303 so that the unnecessary plasma is not generated on the side opposite to the plane opposite to the substrate heater 2 of the ladder electrode 303.

The a-Si film is formed in the following procedure.

At first, the substrate 16 on which the a-Si thin film is formed is placed on the substrate heater 2 whose temperature is set, for example, to 200° C. The $SiH_4$ gas is introduced from the gas supply tube 17, for example, at the velocity of flow of 50 sccm. Then, the pressure within the reactor 1 is adjusted, for example, to 100 mTorr by adjusting the exhaust speed in the vacuum pump system (not shown) connected to the vacuum exhaust pipe 18.

The supply of the high frequency electric power causes the plasma to be generated between the substrate 16 and the ladder electrode 303. The impedance matching device 5 is adjusted such that the high frequency electric power is effectively fed to a region where a plasma 319 is generated. The $SiH_4$ is decomposed in the plasma 319. The a-Si film is formed on the substrate 16. The a-Si film having the necessary thickness is formed, for example, by carrying out the film formation under the above-mentioned condition for about ten minutes.

The configuration examples shown in FIGS. 12 and 13 have the following two features, as compared with the configuration example of FIG. 11.

The first feature lies in the usage of the electrode referred to as the ladder type in which electrode bars of circular cross sections are assembled in the form of ladders without using the flat plate electrode as the electrode. This electrode has the feature that raw material can be uniformly supplied since the $SiH_4$ gas of the raw material freely flows between the electrode bars.

The second feature lies in the fact that the power feeding operation is not carried out at only one point and it is carried out at a plurality of points (in this case, four points).

Presently, the low cost resulting from a film formation at the high speed and the high qualities such as a low defect density, a high crystallinity and the like are required of a thin film transistor for a flat panel display and a thin film semiconductor for a solar cell which are manufactured by using the above-mentioned technique and the like. As a new method of generating a plasma, which satisfies those requirements, there is a method of making a frequency of a high frequency power supply higher (30 MHz to 300 MHz). The fact that the higher qualities and the higher speed of the film formation are both attained by making the frequency higher is disclosed, for example, in "Document Mat. Res. Soc. Symp. Proc. Vol. 424, pp9, 1997". Especially, it has been recently known that this high frequency is suitable for a film formation at a high speed and at a high quality in a microcrystal Si thin film remarked as a new thin film instead of the a-Si.

By the way, the film formation through the high frequency operation has the defect that it is difficult to form a consistent wide area film. This reason is as follows. That is, a wavelength of a high frequency is at an order similar to a size of an electrode. Thus, a voltage distribution resulting from a standing wave mainly caused by a reflected wave occurring in an end of an electrode and the like is induced within the surface of the electrode, which makes the plasma nonuniform. This results in a nonuniform film formation.

In the configuration example exemplified as the ① usage of the parallel plate electrode, if the size of the electrode exceeds 30 cm or if the frequency exceeds 30 MHz, the influence of the standing wave becomes strong, which disables the attainment of a film formation uniformity of 10% that is at least necessary for the film formation of the semiconductor.

FIG. 14 is an example of a voltage distribution resulting from a standing wave at 100 MHz. FIG. 14 simultaneously shows an ion saturation current distribution. The ion saturation current distribution is substantially equal to an electron density distribution. Its measurement is easy. Thus, it is typically used as an index of a plasma distribution. From the voltage distribution, it is understood that the standing wave is induced on the electrode, which accordingly makes the ion saturation current distribution, namely, the plasma distribution nonuniform.

On the other hand, FIGS. 12, 13 exemplified as the ② usage of the ladder electrode have the feature that the standing wave largely induced in the case of the one-point power feeding operation can be reduced by using the four-point power feeding operation, in addition to the usage of the ladder electrode.

However, also in this case, if the size of the electrode exceeds 30 cm or the frequency exceeds 80 MHz, it is difficult to attain the uniform film formation.

FIG. 15 shows the voltage distributions generated on the ladder electrode when the four-point power feeding operation is done at 60 MHz and 100 MHz. Although it shows the relatively uniform voltage distribution at 60 MHz, it shows the nonuniform voltage distribution at 100 MHz.

Also, as for a four-point power feeding position, it is necessary to find out optimal positions in the manner of trial and error. Thus, this requires much labor and time.

Moreover, this has a problem that the change of the film formation conditions, such as the gas pressure and the high frequency electric power and the like, causes the optimal positions to be changed.

The above-mentioned problems are remarked in an academic society. Until now, a method of connecting a reactance (coil) without any loss to a side opposite to the power feeding side of the parallel plate has been proposed, for example, as noted in "Mat. Res. Soc. Symp. Proc.Vol. 377, pp33, 1995".

This reduces a voltage distribution generated on the electrode by changing the reflection condition from the electrode end of the standing wave and accordingly inducing on the electrode the portion where the distribution is relatively flat in the wave form of the standing wave, for example, the portion close to the peak of a sine wave. However, this method does not remove the standing wave at its source. It only generates on the electrode the flat portion in the sine wave. Thus, the portion where the uniform portion can be obtained is about ⅛ of the wavelength. The uniformity about the range beyond it can not be attained in principle.

FIG. 16 shows a voltage distribution when an end of the parallel plate is terminated at a reactance (coil) without any loss at 100 MHz. In this way, a portion until about 30 cm from the end is uniform. However, a portion beyond it is nonuniform. Thus, this portion can not be used for the film formation.

The present invention is accomplished in view of the above mentioned circumstances. Therefore, an object of the present invention is to provide a discharge electrode for improving an uniformity at a discharge such as plasma, a high frequency plasma generator, a method of power feeding to a discharge electrode, and a method of manufacturing semiconductor device.

DISCLOSURE OF INVENTION

A numeral put in parentheses appearing the following description in which a device to solve the problem is represented correspondingly to a claim denotes that it corresponds to a member, a step or an operation in at least one embodiment in a plurality of embodiments in which a content noted in the claim is later-detailed. However, it is not intended that the solving device in the present invention is interpreted under the limitation on the member of the embodiment denoted by the numeral. It is intended to make the corresponding relation evident.

An electrical discharge electrode of the present invention is an electrical discharge electrode for producing a discharge (19) based on a fed high frequency electric power, including: an electrode body (3) to which the high frequency electric power is fed; and a reflected wave protect member (13) preventing an occurrence of a reflected wave of the high frequency electric power fed to the electrode body (3) in the electrode body (3). The discharge may be a plasma (19) generated by a discharging operation.

In the electrical discharge electrode of the present invention, the reflected wave protect member (13) further protects the reflected wave of the high frequency electric power from going into the electrode body (3).

In the electrical discharge electrode of the present invention, the reflected wave protect member (13) prevents an occurrence of a standing wave of the high frequency electric power in the electrode body (3).

In the electrical discharge electrode of the present invention, the electrode body (3) has an output section (9) outputting the fed high frequency electric power to an external portion of the electrode body (3), and wherein the reflected wave protect member (13) is connected to the output section (9) and is a load impedance to the high frequency electric power outputted from the output section (9).

In the electrical discharge electrode of the present invention, the load impedance substantially perfectly absorbs a traveling-wave component in the high frequency electric power outputted from the output section (9) to prevent the occurrence of the reflected wave in the electrode body (3).

In the electrical discharge electrode of the present invention, the load impedance has an impedance matching member (13) having a variable or fixed impedance and a resistor (14).

In the electrical discharge electrode of the present invention, the load impedance (413) has an impedance matching member (413) of which an impedance is variably adjusted, and wherein the impedance of the impedance matching member (413) is variably adjusted based on at least one of a high frequency electric power inputted to the load impedance (413), a high frequency electric power reflected from the load impedance (413), a high frequency electric power consumed in the load impedance (413), a high frequency electric power flowing through the load impedance (413), a voltage applied to the load impedance (413), a current flowing through the load impedance (413) and a phase difference between the current and the voltage of the load impedance (413).

In the electrical discharge electrode of the present invention, the impedance of the impedance matching member (413) is variably adjusted such that one of the high frequency electric power inputted to the load impedance (413) and the high frequency electric power consumed in the load impedance (413) becomes maximum or the high frequency electric power reflected from the load impedance (413) becomes minimum.

In the electrical discharge electrode of the present invention, the load impedance (913) has an impedance matching member (913) of which an impedance is variably adjusted, and wherein the impedance of the impedance matching member (913) is variably adjusted based on respective voltage values in a plurality of sections of the electrode body (3).

In the electrical discharge electrode of the present invention, the electrode body (3) is a ladder type electrode (303).

In the electrical discharge electrode of the present invention, the electrode body (3) receives the high frequency electric power from at least one or more power feeding point section (7) of the electrode body (3), and outputs the high frequency electric power from at least one or more end point section (9) of the electrode body (3), and wherein each of the power feeding point section (7) and the end point section (9) is arranged at a position symmetrical to each other in the electrode body (3).

In the electrical discharge electrode of the present invention, the electrode body (3) receives the high frequency electric power from at least one or more power feeding point section (7) of the electrode body (3), and outputs the high frequency electric power from at least one or more end point section (9) of the electrode body (3), and wherein each of the power feeding point section (7) and the end point section (9) is arranged such that current paths between all point sections in the electrode body (3) and the closest one of the power feeding point sections and the end point sections to one of the all point sections have distances equal to or shorter than ¼ wavelength in a vacuum of the fed high frequency electric power.

In the electrical discharge electrode of the present invention, the electrode body (3) receives the high frequency electric power from at least one or more power feeding point section (7) of the electrode body (3), and outputs the high frequency electric power from at least one or more end point section (9) of the electrode body (3), and wherein a capacitance (1023) is connected in series between the reflected wave protect member (413) and the end point section (309) of the electrode body (3) or between the reflected wave protect member and a ground potential.

In the electrical discharge electrode of the present invention, the capacitance (1023) is a capacitance for bypassing the electrode body (3) in a manner of direct current.

A high frequency plasma generating apparatus of the present invention is a high frequency plasma generating apparatus having an electrical discharge electrode member (3) and generating a plasma based on a high frequency electric power fed to the electrical discharge electrode member (3), and wherein the electrical discharge electrode member (3) has a reflected wave protect member preventing an occurrence of a reflected wave of the high frequency electric power fed to the electrical discharge electrode member (3) in the electrical discharge electrode member (3).

A method of power feeding to an electrical discharge electrode of the present invention includes: providing an electrical discharge electrode (3) having an power feeding point section (7) and a non-specific point section (9) other than the power feeding point section (7); and feeding a high frequency electric power from the power feeding point section (7) to the electrical discharge electrode (3), and wherein the feeding the high frequency electric power includes feeding to the electrical discharge electrode (3) a traveling-wave component of a single-direction to the non-specific point section (9) from the power feeding point section (7), and not-feeding to the electrical discharge electrode (3) a reflected-wave component from the non-specific point section (9) to the power feeding point section (7).

A method of manufacturing a semiconductor by using a plasma CVD method of the present invention includes: providing a semiconductor substrate (16); providing an electrical discharge electrode (3) used in the plasma CVD method, which has a power feeding point section (7) and a non-specific point section (9) other than the power feeding point section; feeding a high frequency electric power from the power feeding point section (7) to the electrical discharge electrode (3); and generating a plasma (19) with the fed high frequency electric power to form a thin film on the semiconductor substrate (16) with the plasma (19), and wherein the feeding the high frequency electric power includes feeding to the electrical discharge electrode (3) a traveling-wave component of a single-direction to the non-specific point section (9) from the power feeding point section (7), and not-feeding to the electrical discharge electrode (3) a reflected-wave component from the non-specific point section (9) to the power feeding point section (7).

The invention of the high frequency discharge electrode of the present invention has at least one or more power feeding point and at least one or more end point. The supply of the high frequency electric power to the discharge electrode is carried out by one-way traveling-wave component from the one or more power feeding point to the one or more end point. An external circuit is connected to the end point so that a reflected wave component is not induced from the end point to the power feeding point.

A load impedance having a resistance component is used as the external circuit connected to the end point.

The load impedance is provided with a variable or fixed impedance matching device and a resistor.

It has an adjusting mechanism for measuring at least one of a high frequency electric power flowing into the load impedance, a high frequency electric power reflected from the load impedance, a high frequency electric power consumed in the load impedance, a voltage applied to the load impedance and a current flowing through the load impedance to adjust the matching device manually or automatically based on the measured value.

The matching device is automatically or manually adjusted such that the high frequency electric power flowing into the load impedance or the high frequency electric power consumed therein becomes maximum or the reflected power becomes minimum.

The high frequency voltage distribution on the electrode is measured to then adjust the matching device automatically or manually based on the distribution.

A ladder type electrode is used for the discharge electrode.

The power feeding point and the end point are arranged at the positions symmetrical to each other in the electrode.

The power feeding point and the end point are arranged such that the current path between any point on the electrode and the closest power feeding point or end point from the point has the distance equal to or shorter than a quarter of the vacuum wavelength of the power supply high frequency electric power.

A capacitor is connected in series between the load impedance and the end point of the high frequency electric power on the electrode or between an earth and the load impedance so that the electrode is bypassed in the manner of direct current.

BEST MODE FOR CARRYING OUT THE INVENTION

Embodiments of a high frequency plasma generator of the present invention will be described below with reference to the attached drawings. Hereafter, the embodiments of the present invention are described. However, the present invention is not limited to it.

[First Embodiment]

Figure 1:
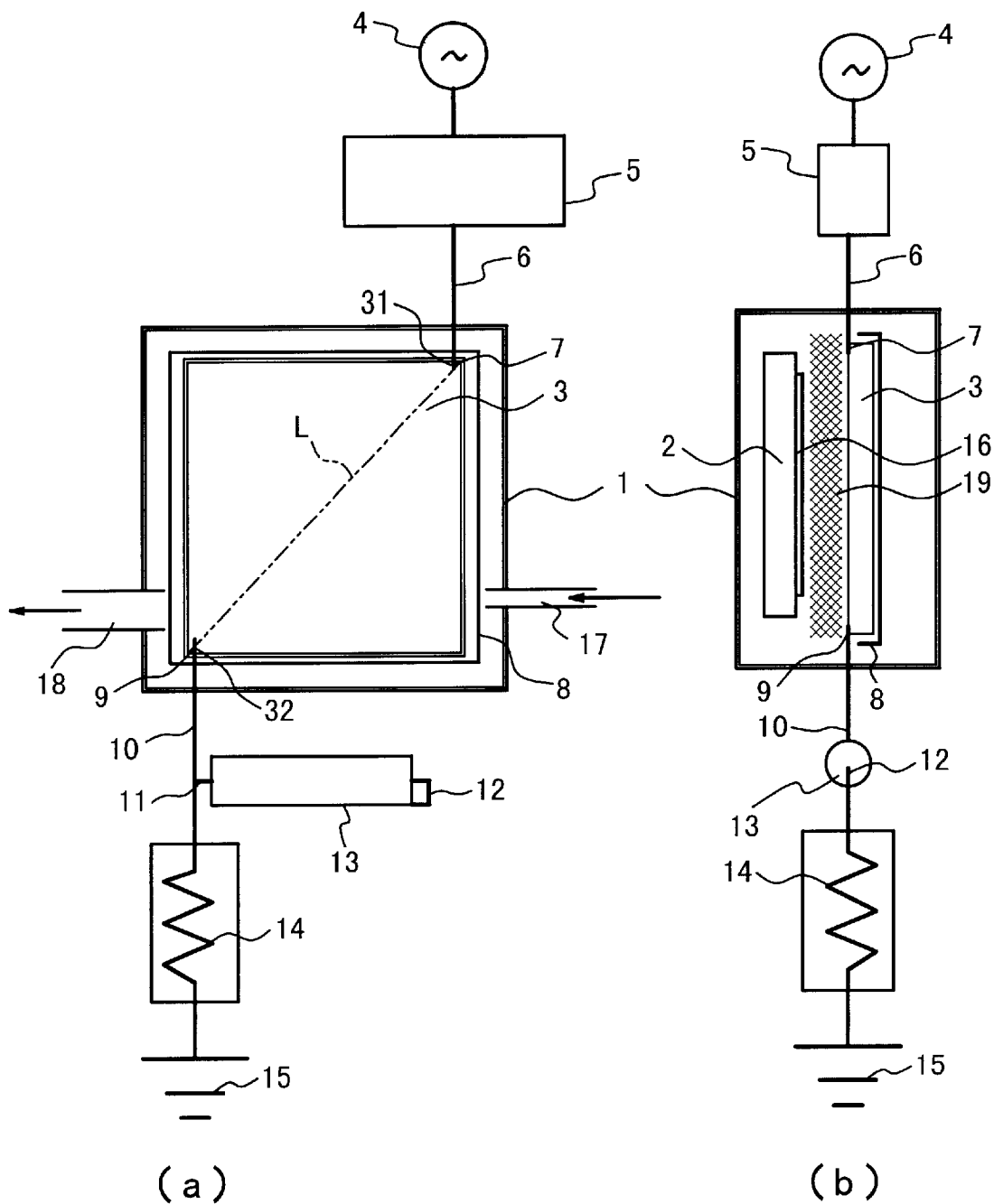
FIG. 1 is a section and connection view showing a first embodiment of a high frequency plasma generator according to the present invention.

FIG. 1 is a configuration view showing a first embodiment. It shows a view (A) when an inner section of a high frequency plasma generator for forming a thin film of an Si semiconductor for a solar cell is viewed from a direction vertical to a surface of a substrate and a view (B) when it is viewed from a direction horizontal thereto. This configuration example is an application example of the present invention to a parallel plate electrode. A consistent film formation is attained by performing a high frequency operation on a substrate 16 of 70 cm×70 cm.

A substrate heater 2 of 80 cm×80 cm is mounted within a reactor 1, and electrically grounded. This substrate heater 2 is used as one flat plate electrode 3. On the other hand, another flat plate electrode 3 of 80 cm×80 cm is mounted at a position opposite to the substrate heater 2, and it is placed, for example, 20 mm away from the substrate heater 2. An external high frequency power supply 4 is connected through an impedance matching device 5 and a coaxial cable 6 to the latter flat plate electrode 3. An power feeding point 7 is defined as one point of a corner 31 on the flat plate electrode 3.

An earth shield 8 is mounted near the flat plate electrode 3 so that the unnecessary plasma is not induced on a side opposite to a plane opposite to the substrate heater 2 of the flat plate electrode 3. The earth shield 8 is mounted so as to cover an outer side of the flat plate electrode 3 and a rear side thereof. A gap from the flat plate electrode 3 to the earth shield 8 is set at 2 mm or less.

An end point 9 is mounted at a corner 32 in a position symmetrical to the power feeding point 7 of the flat plate electrode 3, and an end cable 10 is connected thereto. The end cable 10 is branched at a T-branch connector 11. One end thereof is connected to a coaxial cable matching device 13 whose tip is connected to a short-circuit connector 12. The other end of the end cable 10 is connected to a 50Ω end resistor 14, and grounded to an earth 15.

Figure 2:
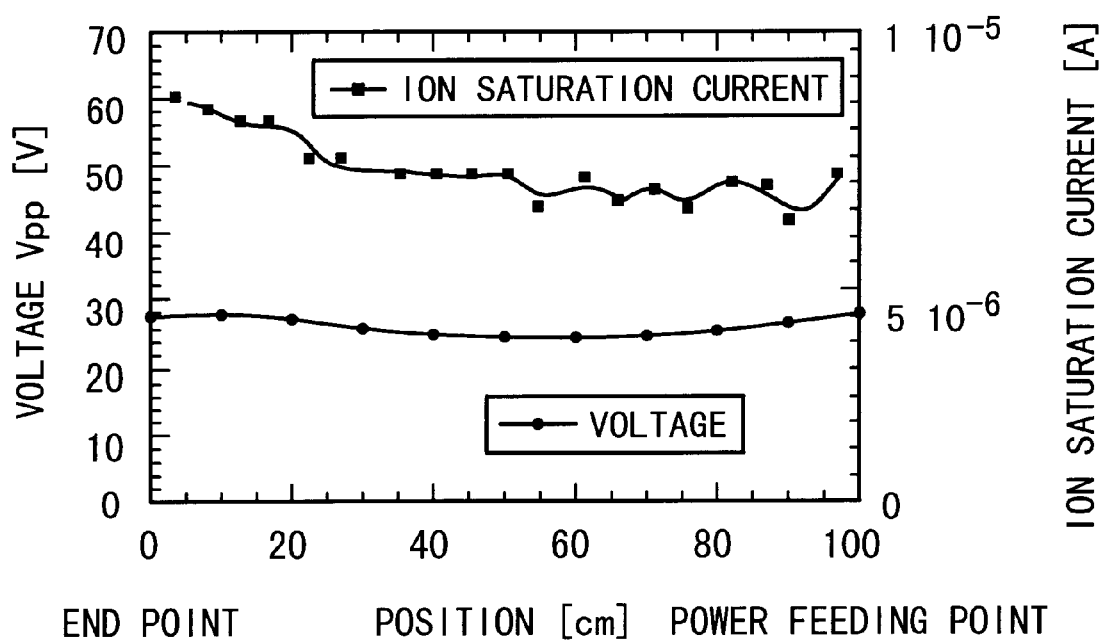
FIG. 2 is a view showing a voltage distribution and an ion saturation current distribution obtained from the first embodiment of the high frequency plasma generator according to the present invention.

Prior to the film formation, it is tried to obtain the optimal distribution by adjusting a length of the coaxial cable matching device 13 while measuring the uniformity of the ion saturation current distribution and the voltage distribution on the flat plate electrode 3 in this embodiment. FIG. 2 shows its result. In FIG. 2, the measuring is performed on a diagonal line L from the power feeding point 7 to the end point 9 of the flat plate electrode 3. The ion saturation current distribution is measured by sweeping a center of 20 mm implying a distance between the electrodes with a probe. It is measured in Ar gas of 100 mTorr. Typically, the ion saturation current distribution is substantially equal to a plasma distribution.

Figure 15:
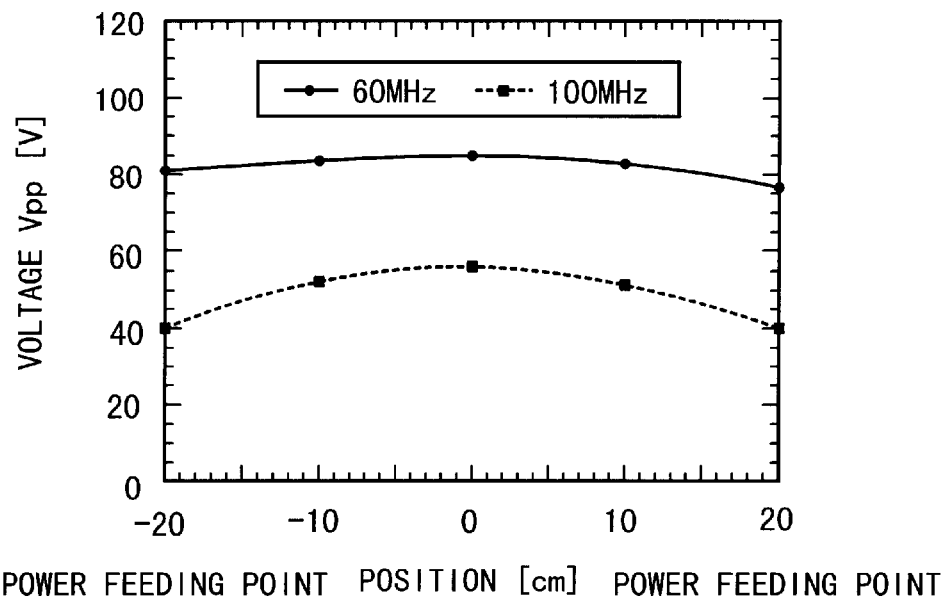
FIG. 15 is a view showing a voltage distribution when a four-point power feeding operation is performed on a ladder electrode at 60 MHz and 100 MHz.
Figure 16:
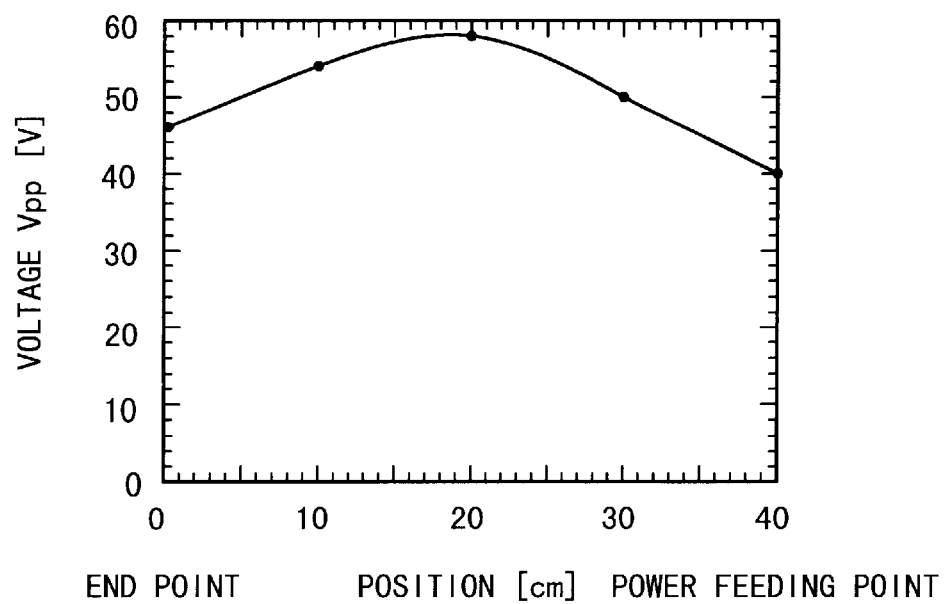
FIG. 16 is a view showing a voltage distribution when an end of a parallel plate is terminated at a reactance at 100 MHz.

As can be understood from the comparison between FIG. 2 and FIGS. 15, 16, the uniformity of the plasma distribution and the voltage distribution on the electrode can be attained in a very wide range, in the generation of the high frequency plasma according to this embodiment, as compared with the conventional method.

This reason is as follows. That is, proper loads 13, 14 having resistive components are connected to the end point 9. Accordingly, a traveling-wave component of a high frequency electric power flowing into the end point 9 can be perfectly absorbed to thereby avoid a reflected wave from being induced. Thus, the standing wave can not be induced in the electrode 3. It may be considered that only the traveling-wave is present in the electrode 3 and that there is no reflected wave in the electrode 3.

Next, the a-Si film formation or the microcrystal Si film formation is carried out in the following procedure.

At first, a substrate 16 of 70 cm×70 cm on which the Si thin film is formed is placed on the substrate heater 2 whose temperature is set, for example, to 200° C. SiH$_4$ gas is introduced from a gas supply tube 17, for example, at a velocity of flow of 50 sccm. Moreover, in the case of the microcrystal Si film formation, hydrogen gas is introduced, for example, at 2000 sccm, in addition to the SiH$_4$ gas. Then, a pressure within the reactor 1 is adjusted, for example, to 100 mTorr by adjusting an exhaust speed in a vacuum pump system (not shown) connected to a vacuum exhaust pipe 18. A high frequency electric power of, for example, 60 MHz, 100 W is fed to thereby generate a plasma between the substrate 16 and the flat plate electrode 3. The impedance matching device 5 is adjusted such that the high frequency electric power is effectively fed to a plasma 19. The SiH$_4$ is decomposed in the plasma 19. Accordingly, the a-Si film or the microcrystal Si film is formed on the surface of the substrate 16. The film having a necessary thickness is formed, for example, by carrying out the film formation under the above-mentioned condition for about ten minutes. It is tried to obtain the optimal distribution by measuring a film thickness distribution of a sample after the film formation and slightly adjusting the length of the coaxial cable matching device 13.

As for a film formation speed, for example, a high speed of 10 Å/s can be obtained in the microcrystal film formation. The uniformity is ±10%. So, it is possible to attain the uniformity necessary for the Si thin film semiconductor for the solar cell.

[Second Embodiment]

Figure 3:
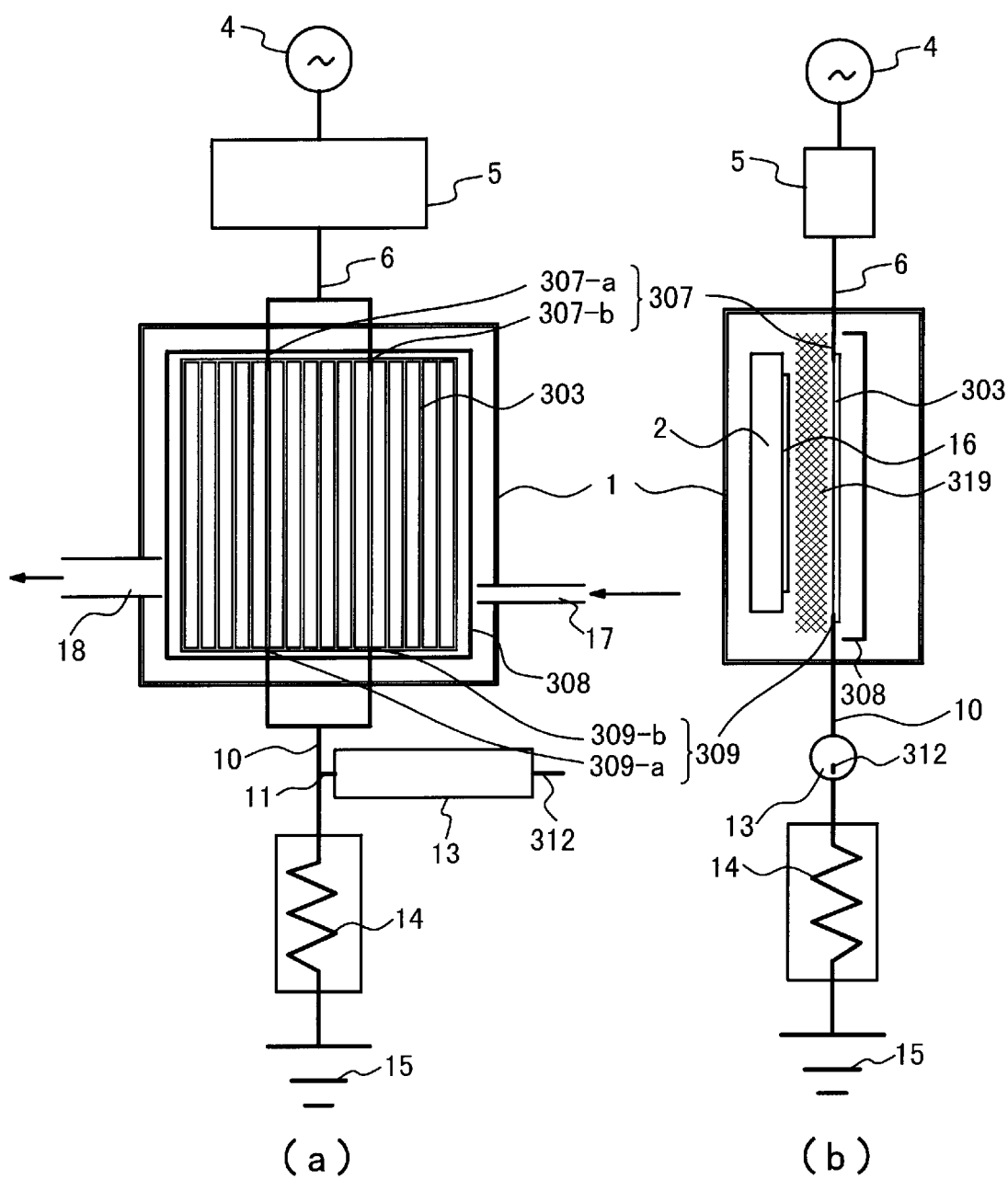
FIG. 3 is a section and connection view showing a second embodiment of the high frequency plasma generator according to the present invention.

FIG. 3 is a configuration view of a second embodiment in which the flat plate electrode 3 shown in FIG. 1 is replaced by a ladder electrode 303, and a modification is added to the detailed portion. Also in this configuration example, the consistent film formation is done by performing the high frequency operation on the substrate of 70 cm×70 cm.

The substrate heater 2 of 80 cm×80 cm is mounted within the reactor 1, and electrically grounded. This substrate heater 1 is used as one electrode. On the other hand, the ladder electrode 303 of 80 cm×80 cm is mounted at a position opposite to the substrate heater 2, and it is placed, for example, 20 mm away from the substrate heater 2. The external high frequency power supply 4 is connected through the impedance matching device 5 and the coaxial cable 6 to the ladder electrode 303.

Power feeding points 307(a,b) are mounted at two points in the upper portion of the ladder electrode, as shown in FIG. 3. The positional mutual relation between the two points is the symmetrical position of the ladder electrode 303. On the other hand, end points 309(a,b) are mounted at two points of the positions symmetrical to the above-mentioned two points.

In this embodiment, the configuration of the two power feeding points 307 and the two end points 309 provides the effect resulting from the following reason. That is, the implementation of the first embodiment enables the theoretically perfect removal of the standing wave. However, a reflection is actually induced in a discontinuous portion of a characteristic impedance such as the end point 309 and the like. Thus, the standing wave is slightly induced. In order to reduce the influence of the slight standing wave to a minimum, the shortest current path distance from all the points on the electrode 303 to the power feeding point 307 or the end point 309 is set to be equal to or less than a quarter of the wavelength implying a distance between a crest and a trough of the standing wave.

In the first embodiment, the uniform plasma distribution can be obtained when the frequency of the high frequency operation is 60 MHz. However, the sufficient uniformity can not be obtained when it is 100 MHz. This is because while the quarter-wavelength long at 100 MHz is 75 cm, in the first embodiment, the distance of the shortest current path from the power feeding point 7 or the end point 9 to the center of the electrode is 80 cm, which exceeds the quarter-wavelength long. So, this embodiment tries to increase the numbers of power feeding points 307 and end points 309 and thereby reducing the distance and accordingly attaining the uniformity at 100 MHz.

An earth shield 308 is mounted around the ladder electrode 303 so that the unnecessary plasma is not generated, and the SiH$_4$ gas supplied from the gas supply pipe 17 effectively flows between the substrate heater 2 and the ladder electrode 303 not to diffuse into the unnecessary space. The earth shield 308 is mounted such that it covers the outer side and the rear side of the ladder electrode 303, and the gap from the ladder electrode 303 to the earth shield 308 is about 20 mm.

The end cable 10 is connected to the end points 309(a,b). The end cable 10 is branched at the T-branch connector 11, and one end of the end cable 10 is connected to the coaxial cable matching device 13 whose tip is connected to an open connector 312. In the first embodiment, the tip connector is the short-circuit connector 12. However, in this embodiment, the distribution can be made uniform by using the coaxial cable 13 in which the open connector 312 is shorter. The other end of the T-branch connector 11 is connected to the 50Ω end resistor 14, and grounded to the earth 15. Similarly to the first embodiment, the optimal plasma uniformity can be attained by adjusting the length of the coaxial cable matching device 13 while measuring the plasma distribution.

Next, the a-Si film formation or the microcrystal Si film formation is carried out in the following procedure.

At first, the substrate 16 of 70 cm×70 cm on which the Si thin film is formed is placed on the substrate heater 2 whose temperature is set, for example, to 200° C. The SiH$_4$ gas is introduced from the gas supply tube 17, for example, at the velocity of flow of 50 sccm. Moreover, in the case of the microcrystal Si film formation, the hydrogen gas is introduced, for example, at 2000 sccm, in addition to the SiH$_4$ gas. Then, the pressure within the reactor 1 is adjusted, for example, to 100 mTorr by adjusting the exhaust speed in the vacuum pump system (not shown) connected to the vacuum exhaust pipe 18. The high frequency electric power of, for example, 100 MHz, 100 W is fed to thereby generate a plasma 319 between the substrate 16 and the ladder electrode 303. The impedance matching device 5 is adjusted such that the high frequency electric power is effectively fed to the plasma 319. The SiH$_4$ is decomposed in the plasma 319. Accordingly, the a-Si film or the microcrystal Si film is formed on the substrate 16. The film having a necessary thickness is formed, for example, by carrying out the film formation under the above-mentioned condition for about ten minutes. It is tried to obtain the optimal distribution by measuring the film thickness distribution of the sample after the film formation and slightly adjusting the length of the coaxial cable matching device 13. The optimal length of the coaxial cable is different depending on the gas pressure, the flow amount, the frequency, the power and the like. Hence, the cable necessary therefor is used.

As for the film formation speed, for example, a high speed of 15 Å/s can be obtained in the microcrystal film formation. The uniformity is ±10%. So, it is possible to attain the uniformity necessary for the Si thin film semiconductor for the solar cell.

[Third Embodiment]

Figure 4:
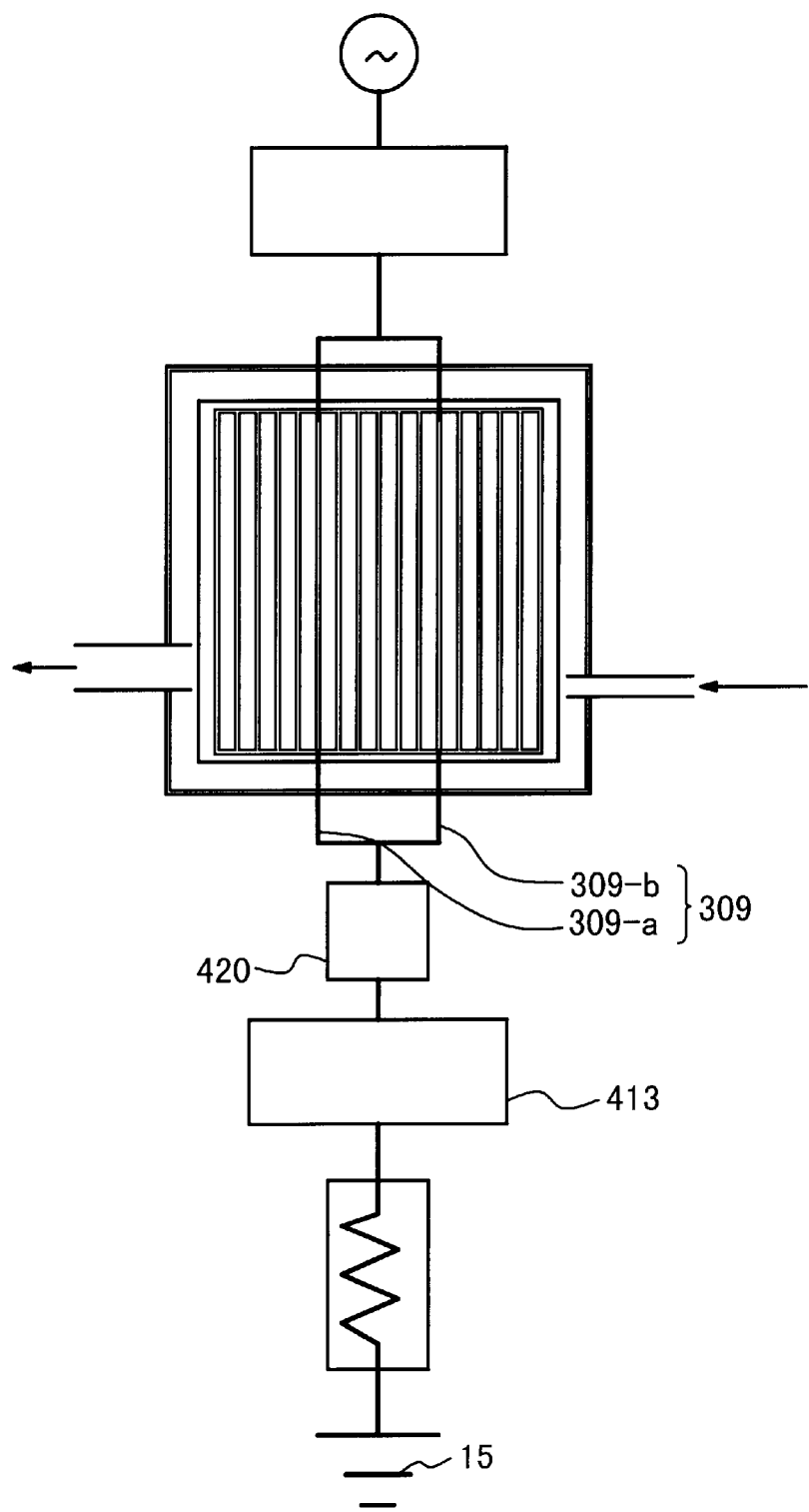
FIG. 4 is a section and connection view showing a third embodiment of the high frequency plasma generator according to the present invention.

FIG. 4 is a configuration view of a third embodiment in which the coaxial cable matching device 13 shown in FIG. 3 is replaced by a variable impedance matching device 413, and a pass type power meter 420 for measuring a power flowing into the variable impedance matching device 413 is mounted between the end point 309(a,b) and the variable impedance matching device 413.

The configuration except the structure from the end point 309(a,b) to the earth 15 is equal to that of the second embodiment. Thus, the difference in the structure from the end point 309(a,b) to the earth 15 is described.

Figure 5:
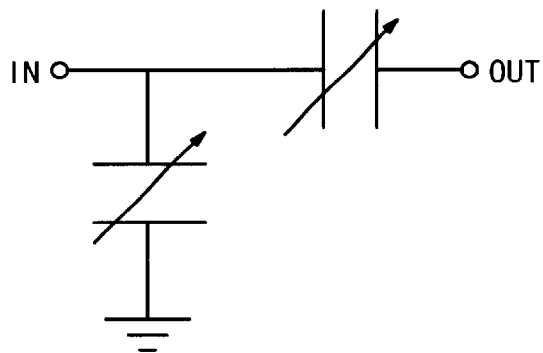
FIG. 5 is a circuit diagram of an L-type matching device.
Figure 6:
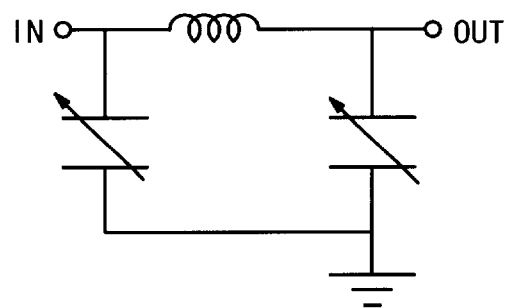
FIG. 6 is a circuit diagram of an π-type matching device.
Figure 7:
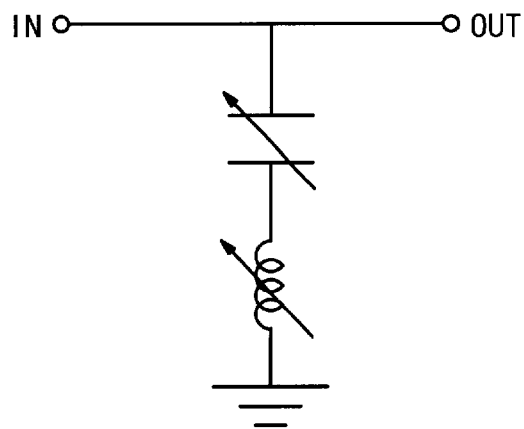
FIG. 7 is a circuit diagram of a stub type matching device.
Figure 8:
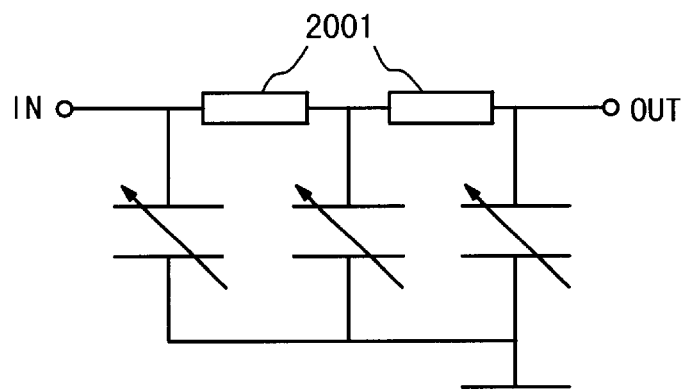
FIG. 8 is a circuit diagram of a variable capacitance type matching device.

At first, the second embodiment uses the coaxial cable matching device 13 that has the fixed impedance. The usage of the fixed impedance is difficult to adjust the impedance. Moreover, the configuration of using only one coaxial cable matching device 13 as described in the first and second embodiments disables the perfect adjustment. So, this embodiment uses the variable impedance matching device 413 to thereby enable the easy adjustment. As for the variable impedance matching device 413, for example, an L-type matching device shown in FIG. 5, a π-type matching device shown in FIG. 6, a stub type matching device shown in FIG. 7 and a variable capacitance type matching device shown in FIG. 8 and the like can be used. In this case, the π-type matching device is used. In FIG. 8, a symbol 2001 denotes a coaxial cable.

It takes a very long time to attain the optimization if a two-dimensional distribution of a plasma and a film thickness is measured on each occasion, in order to obtain the uniform distribution as exemplified in the first and second embodiments.

So, in this embodiment, it is considered to measure the power flowing into the variable impedance matching device 413 to use as an index, instead of measuring the uniformity. The nonuniformity is caused by the generation of the standing wave. The standing wave is generated by the reflection at the endpoint. The standing wave is never generated if there is no reflection at the end point 309. The fact that there is no reflection at the end point implies that all the high frequency electric powers flowing into the end points 309 flow into the side of the variable impedance matching device 413. Thus, the fact is equivalent to a fact that the power flowing into the side of the variable impedance matching device 413 becomes maximum. That is, if the power flowing into the variable impedance matching device 413 is measured by the pass type power meter 420 and then it is adjusted so as to be maximum, the standing wave can be removed to thereby attain the uniformity.

When this method is actually carried out, the uniformity distribution similar to that of FIG. 2 can be easily obtained to thereby make the speed of the adjustment faster.

Moreover, in order to automate this adjustment, a feedback control is performed on the variable impedance matching device 413 so that the power flowing into the variable impedance matching device 413 becomes maximum.

Accordingly, the adjustment for the uniformity can be automated to instantly carry out the optimal adjustment even under any film formation condition.

[Fourth Embodiment]

Figure 9:
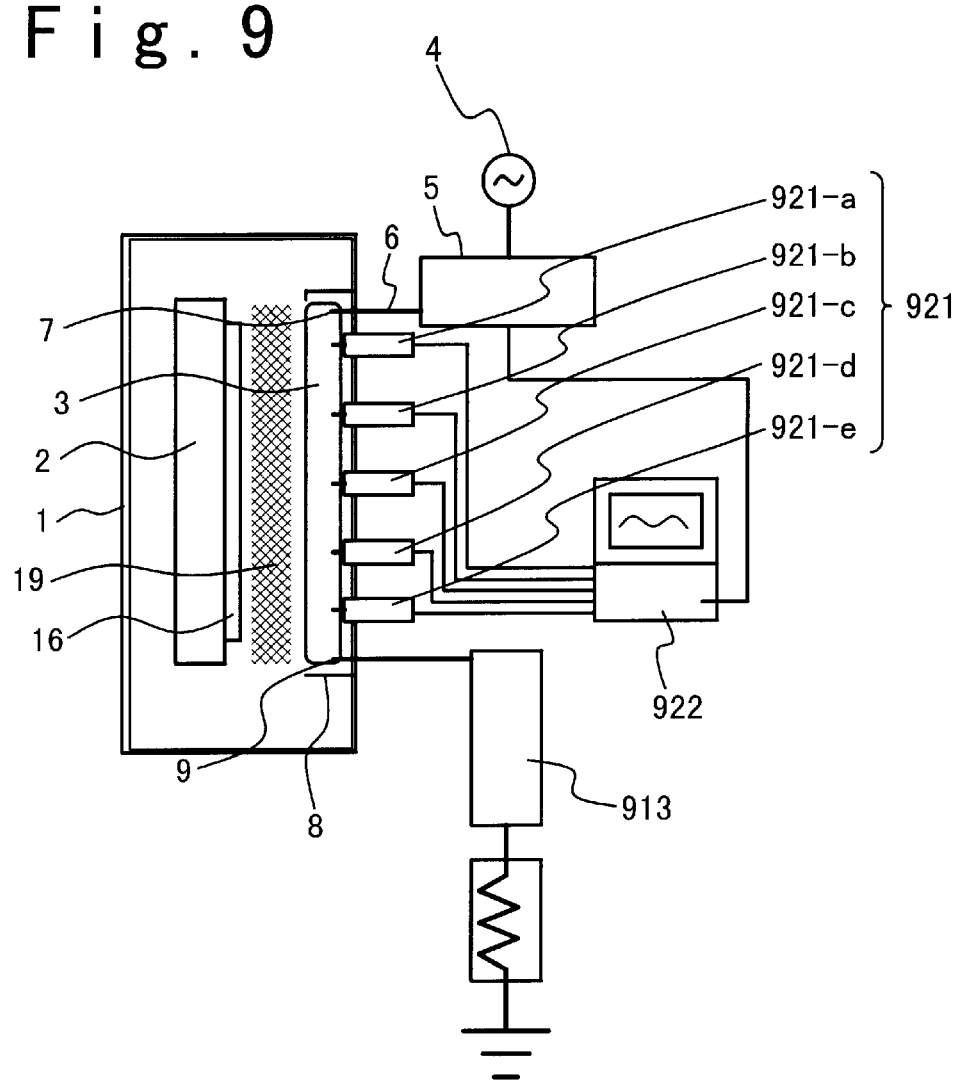
FIG. 9 is a section and connection view showing a fourth embodiment of the high frequency plasma generator according to the present invention.

FIG. 9 shows a fourth embodiment. In the configuration of the fourth embodiment, a plurality of voltage probes 921(a to e) for measuring a high frequency voltage distribution on the rear side of the flat plate electrode 3 is added to the configuration using the parallel plate electrodes in the first embodiment. The load impedance 13 is replaced by a variable impedance matching device 913. Moreover, a personal computer 922 for automatically adjusting the variable impedance matching device 913 is added such that the measured values of the plurality of voltage probes 921(a to e) are collected to make its distribution uniform.

This configuration enables the high frequency voltage distribution on the flat plate electrode to be automatically controlled in the optimal manner, and thereby enables the plasma 19 and the film thickness distribution to be made uniform.

The actually obtained film thickness distribution is within ±7% in the substrate of 70 cm×70 cm.

[Fifth Embodiment]

Figure 10:
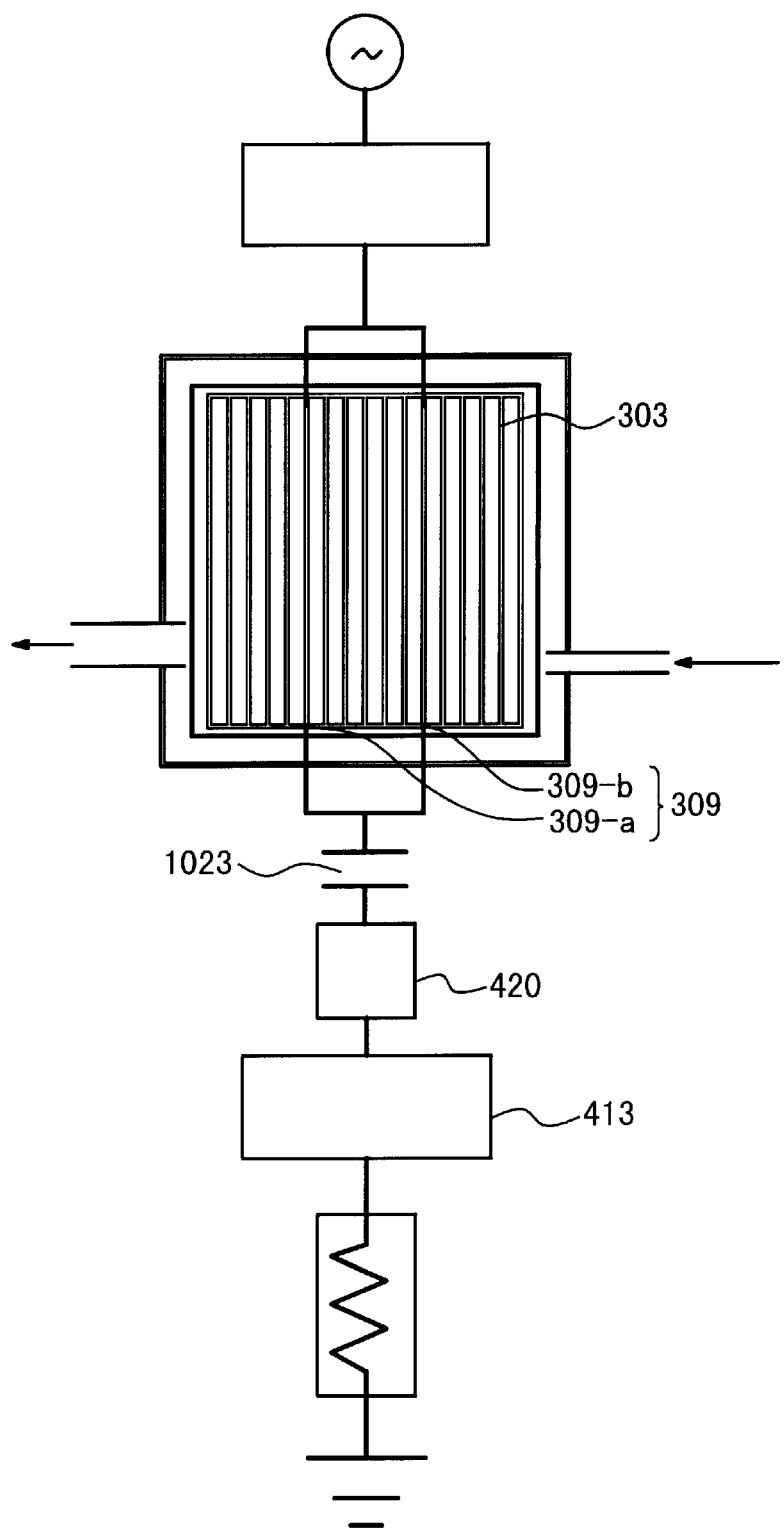
FIG. 10 is a section and connection view showing a fifth embodiment of the high frequency plasma generator according to the present invention.
Figure 11:
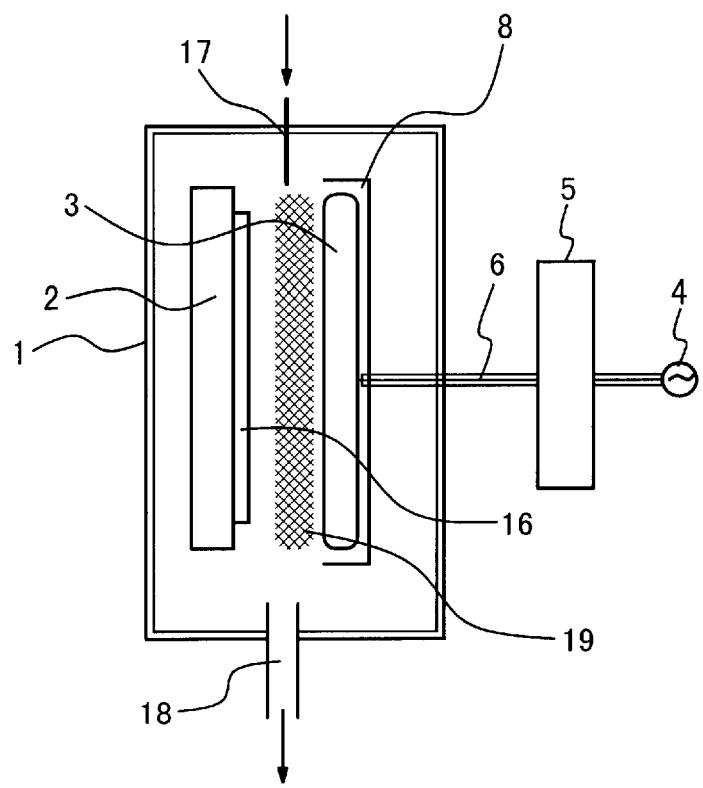
FIG. 11 is a configuration view of a PCVD apparatus when a power is fed to one point at a center on a rear side of a parallel plate electrode, as an example of a conventional technique.
Figure 12:
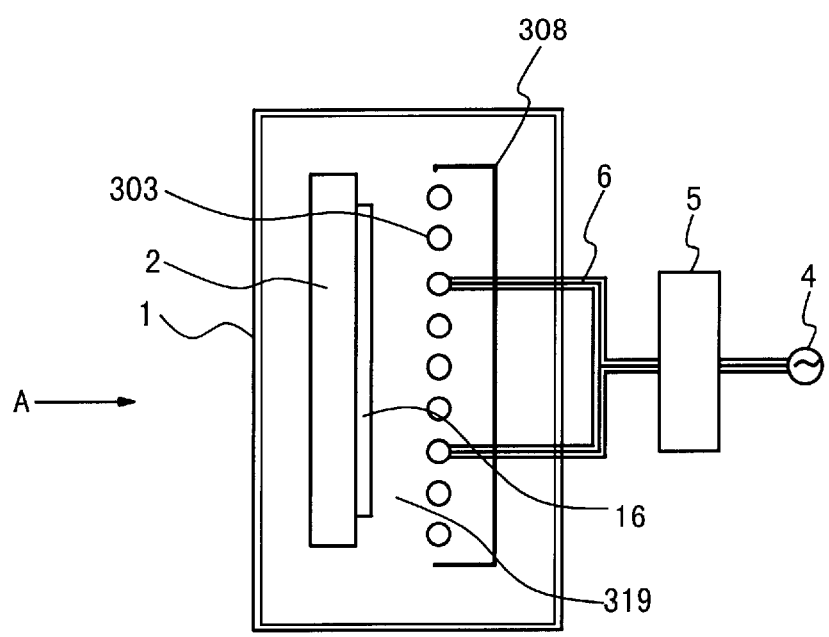
FIG. 12 is a configuration view of a PCVD apparatus when a power is fed to four points around a ladder electrode, as an example of a conventional technique.
Figure 13:
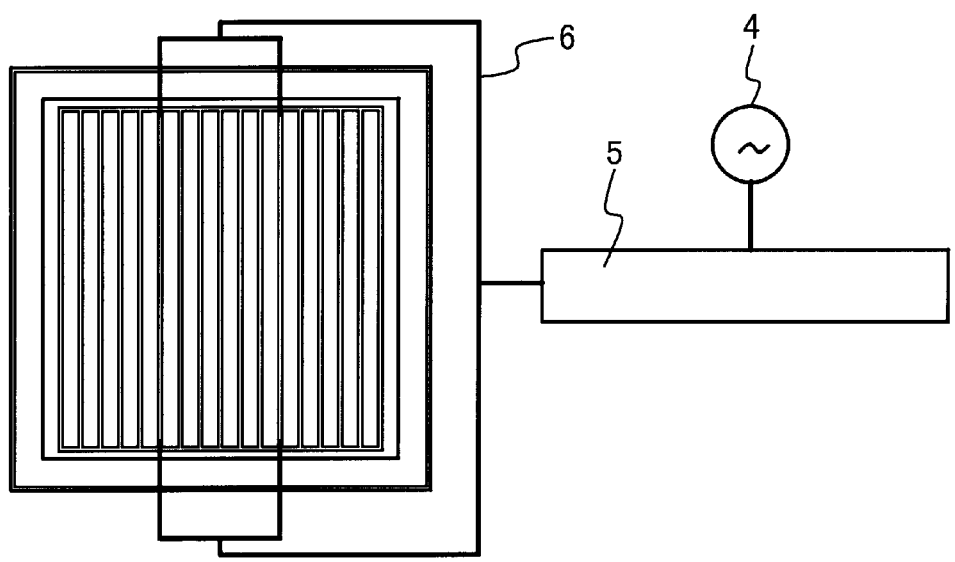
FIG. 13 is a view when the PCVD apparatus in which the power is fed to the four points around the ladder electrode is viewed from a direction vertical to FIG. 12.
Figure 14:
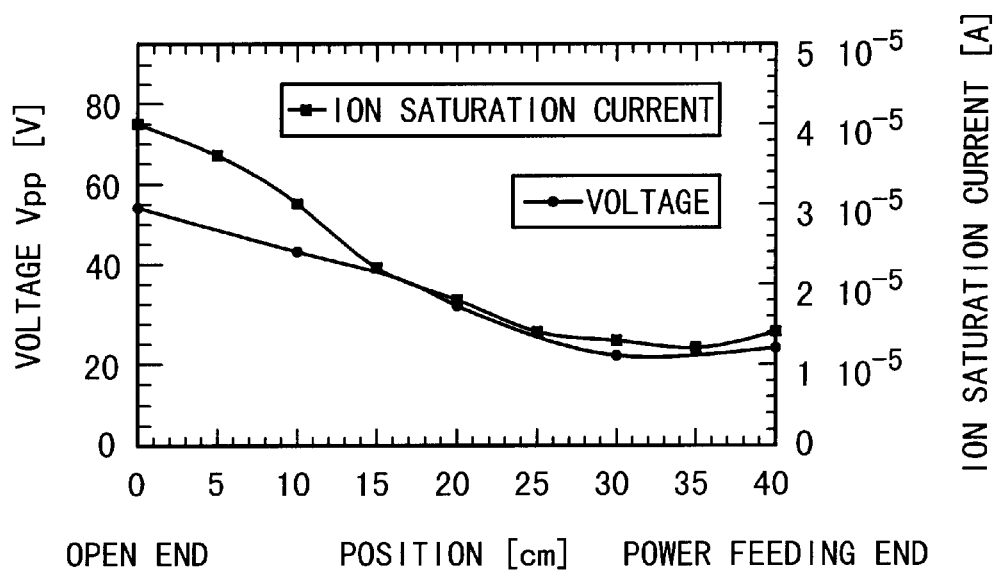
FIG. 14 is a view showing an voltage distribution and an ion saturation current distribution when a power is fed to one point of an electrode at 100 MHz.

FIG. 10 shows a fifth embodiment. The configuration of the fifth embodiment is changed in such a way that a capacitor 1023 is inserted between the end point 309 and the pass type power meter 420 of the third embodiment shown in FIG. 4.

In the third embodiment shown in FIG. 4, if the π-type matching device, the stub type matching device, the variable capacitance type matching device or the like is used in the variable impedance matching device 413, an input side and an output side of each of those matching devices are not separated from each other in the manner of direct current. Thus, the ladder electrode 303 serving as the electrode on the high frequency application side is grounded in the manner of the direct current (dropped to the earth potential).

If the electrode 303 on the high frequency application side is grounded in the manner of the direct current, in the condition that a bias voltage is zero, the voltage of the electrode 303 has the shape in which the high frequency voltage is present in a positive area and a negative area with zero as a center.

On the other hand, if the capacitor 1023 is inserted as shown in this embodiment, a voltage of the electrode is biased to a definite negative voltage. So, the high frequency voltage has a shape with it as a center. In this case, a plasma potential is lower as compared with the case in which the bias voltage is zero. Thus, an energy of an ion incident upon the surface of the substrate 16 from the plasma 319 becomes low. The principle that if the bias voltage is negative, the plasma potential becomes low and the energy of the ion becomes low is noted in "Base of Plasma Processing" written by Ph.D. Brain and N. Chapman, translated by Yukio Okamoto and sold by Denki Shoin (1985).

Typically, in the a-Si film formation or the microcrystal Si film formation, the excellent film can be formed as the energy of the incident ion is lower. Thus, in this embodiment, the insertion of the capacitor 1023 enables the excellent film to be formed.

Actually, the crystallinity of the microcrystal Si film formed according to this embodiment exceeds 9:1 in a Raman peak ratio. This is excellent as compared with 8:1 in the case when the capacitor 1023 is not inserted.

According to the present invention, it is possible to extremely improve the uniformity of the wide area plasma generated through the high frequency operation.

INDUSTRIAL APPLICABILITY

The present invention is useful in forming the film of the semiconductor, such as the amorphous silicon, the microcrystal silicon, the polycrystal thin film silicon, the silicon nitride and the like, used in the solar cell, the thin film transistor and the like, and etching the film of the semiconductor and the like. According to the present invention, it is possible to extremely improve the uniformity of the wide area plasma generated through the high frequency operation.

What is claimed is:

1. An electrical discharge electrode for producing a discharge based on a fed high frequency electric power, comprising:
   an electrode body to which said high frequency electric power is fed; and
   a reflected wave protect member preventing an occurrence of a reflected wave of said high frequency electric power fed to said electrode body in said electrode body.

2. The electrical discharge electrode according to claim 1, wherein said reflected wave protect member further protects said reflected wave of said high frequency electric power from going into said electrode body.

3. The electrical discharge electrode according to claim 1, wherein said reflected wave protect member prevents an occurrence of a standing wave of said high frequency electric power in said electrode body.

4. The electrical discharge electrode according to claim 1, wherein said electrode body has an output section outputting said fed high frequency electric power to an external portion of said electrode body, and
   wherein said reflected wave protect member is connected to said output section and is a load impedance to said high frequency electric power outputted from said output section.

5. The electrical discharge electrode according to claim 4, wherein said load impedance substantially perfectly absorbs a traveling-wave component in said high frequency electric power outputted from said output section to prevent said occurrence of said reflected wave in said electrode body.

6. The electrical discharge electrode according to claim 4, wherein said load impedance has an impedance matching member having a variable or fixed impedance and a resistor.

7. The electrical discharge electrode according to claim 4, wherein said load impedance has an impedance matching member of which an impedance is variably adjusted, and
   wherein said impedance of said impedance matching member is variably adjusted based on at least one of a high frequency electric power inputted to said load impedance, a high frequency electric power reflected from said load impedance, a high frequency electric power consumed in said load impedance, a high frequency electric power flowing through said load impedance, a voltage applied to said load impedance, a current flowing through said load impedance and a phase difference between said current and said voltage of said load impedance.

8. The electrical discharge electrode according to claim 7, wherein said impedance of said impedance matching member is variably adjusted such that one of said high frequency electric power inputted to said load impedance and said high frequency electric power consumed in said load impedance becomes maximum or said high frequency electric power reflected from said load impedance becomes minimum.

9. The electrical discharge electrode according to claim 4, wherein said load impedance has an impedance matching member of which an impedance is variably adjusted, and wherein said impedance of said impedance matching member is variably adjusted based on respective voltage values in a plurality of sections of said electrode body.

10. The electrical discharge electrode according to claim 1, wherein said electrode body is a ladder type electrode.

11. The electrical discharge electrode according to claim 1, wherein said electrode body receives said high frequency electric power from at least one or more power feeding point section of said electrode body, and outputs said high frequency electric power from at least one or more end point section of said electrode body, and
    wherein each of said power feeding point section and said end point section is arranged at a position symmetrical to each other in said electrode body.

12. The electrical discharge electrode according to claim 1, wherein said electrode body receives said high frequency electric power from at least one or more power feeding point section of said electrode body, and outputs said high frequency electric power from at least one or more end point section of said electrode body, and
    wherein each of said power feeding point section and said end point section is arranged such that current paths between all point sections in said electrode body and the closest one of said power feeding point sections and said end point sections to one of said all point sections have distances equal to or shorter than ¼ wavelength in a vacuum of said fed high frequency electric power.

13. The electrical discharge electrode according to claim 1, wherein said electrode body receives said high frequency electric power from at least one or more power feeding point section of said electrode body, and outputs said high frequency electric power from at least one or more end point section of said electrode body, and
    wherein a capacitance is connected in series between said reflected wave protect member and said end point section of said electrode body or between said reflected wave protect member and a ground potential.

14. The electrical discharge electrode according claim 13, wherein said capacitance is a capacitance for bypassing said electrode body in a manner of direct current.

15. A high frequency plasma generating apparatus having an electrical discharge electrode member and generating a plasma based on a high frequency electric power fed to said electrical discharge electrode member:
    wherein said electrical discharge electrode member has a reflected wave protect member preventing an occurrence of a reflected wave of said high frequency electric power fed to said electrical discharge electrode member in said electrical discharge electrode member.

16. A method of power feeding to an electrical discharge electrode, comprising:
    providing an electrical discharge electrode having an power feeding point section and a non-specific point section other than said power feeding point section; and
    feeding a high frequency electric power from said power feeding point section to said electrical discharge electrode, and
    wherein said feeding said high frequency electric power includes feeding to said electrical discharge electrode a traveling-wave component of a single-direction to said non-specific point section from said power feeding point section, and not-feeding to said electrical discharge electrode a reflected-wave component from said non-specific point section to said power feeding point section.

17. A method of manufacturing a semiconductor by using a plasma CVD method, comprising:
    providing a semiconductor substrate;
    providing an electrical discharge electrode used in said plasma CVD method, which has a power feeding point section and a non-specific point section other than said power feeding point section;
    feeding a high frequency electric power from said power feeding point section to said electrical discharge electrode; and
    generating a plasma with said fed high frequency electric power to form a thin film on said semiconductor substrate with said plasma, and wherein said feeding said high frequency electric power includes feeding to said electrical discharge electrode a traveling-wave component of a single-direction to said non-specific point section from said power feeding point section, and not-feeding to said electrical discharge electrode a reflected-wave component from said non-specific point section to said power feeding point section.

* * * * *